United States Patent [19]

Abe et al.

[11] Patent Number: 4,984,875

[45] Date of Patent: Jan. 15, 1991

[54] OPTICAL COMPONENT AND MAGNETIC-FIELD SENSOR USING SUPERPOSED SINGLE CRYSTAL ELEMENTS HAVING DIFFERENT OPTICAL PROPERTIES

[75] Inventors: Hiroaki Abe; Shuhei Toyoda, both of Nagoya, Japan

[73] Assignee: NGK Insulators, Ltd., Japan

[21] Appl. No.: 384,502

[22] Filed: Jul. 25, 1989

[30] Foreign Application Priority Data

Jul. 28, 1988 [JP] Japan .................................. 63-188951

[51] Int. Cl.$^5$ ........................... G02F 1/09; G02B 1/02
[52] U.S. Cl. .................................... 350/377; 350/378;
350/387; 350/405; 356/365
[58] Field of Search ................ 350/375, 376, 377, 378, 350/387, 388, 401, 405; 356/365

[56] References Cited

U.S. PATENT DOCUMENTS

| | | | |
|---|---|---|---|
| 3,529,885 | 9/1970 | Ammann | 350/405 |
| 3,540,795 | 11/1970 | Harris | 350/405 |
| 4,339,301 | 7/1982 | Matsuzawa et al. | 156/603 |
| 4,341,442 | 7/1982 | Johnson | 350/372 |
| 4,478,872 | 10/1984 | Pulliam . | |
| 4,607,916 | 8/1986 | Sanford et al. | 350/376 |

FOREIGN PATENT DOCUMENTS

| | | |
|---|---|---|
| 208476 | 1/1987 | European Pat. Off. . |
| 58-140716 | 8/1983 | Japan . |
| 61-250572 | 11/1986 | Japan . |
| 8606503 | 11/1986 | PCT Int'l Appl. . |

OTHER PUBLICATIONS

Nicholas et al., "Diffusion Bonding Ceramics with Ductile Interlayer," *Science of Ceramics* 14, Ed. Derek Taylor, Institute of Ceramics, 1988, Shelton, UK, pp. 539–544.

Machida et al., "Temperature-Compensated Faraday Rotator for Optical Isolator," *Optoelectronics*, vol. 3, No. 1, pp. 99–105, Jun. 1988.

Patent Abstracts of Japan, vol. 8, No. 31 (P-253) [1468] [JP-A-58 186 705].

*Primary Examiner*—Bruce Y. Arnold
*Assistant Examiner*—Martin Lerner
*Attorney, Agent, or Firm*—Parkhurst, Wendel & Rossi

[57] ABSTRACT

An optical unit or an optical sensor through which a light beam is propagated in a predetermined direction, having an optical component which includes at least one first single crystal element each having a property of causing dextrorotation of a plane of polarization of the light beam during propagation of the beam, and at least one second single crystal element each having a property of causing levorotation of the plane of polarization of the light beam. The first and second single crystal elements are superposed on each other in a direction perpendicular to the direction of propagation of the beam. The single crystal elements may be bonded together by direct solid-solid reaction, or by diffusion of a material of a thin bonding film interposed between the adjacent single crystal elements. The single crystal elements also exhibit a magnetooptical or Faraday effect when used in a magnetic-field sensor, for example.

5 Claims, 2 Drawing Sheets

OPTICAL COMPONENT AND MAGNETIC-FIELD SENSOR USING SUPERPOSED SINGLE CRYSTAL ELEMENTS HAVING DIFFERENT OPTICAL PROPERTIES

BACKGROUND OF THE INVENTION

1. Field of the Invention

The present invention relates to an optical component consisting of a single crystal element or elements having a property of causing dextrorotation (clockwise rotation) of a plane of polarization of a light beam propagated therethrough, and a single crystal element or elements having a property of causing levorotation (counterclockwise rotation) of the beam polarization plane, or an optical magnetic-field sensor including an optical component consisting of a single crystal element or elements having the properties of causing the dextrorotation of the polarization plane and producing a magnetooptical effect or the Faraday effect, and a single crystal element or elements having the properties of causing levorotation of the polarization plane and producing the magnetooptical effect or the Faraday effect.

2. Discussion of the Prior Art

As one optical component of an optical unit, there is known an optical component of a type which consists of a single crystal element having a property of causing dextrorotation of the plane of polarization of a light beam during propagation of the beam through the element, and a single crystal element having a property of causing levorotation of the polarization plane of the beam. An example of such an optical component is disclosed in laid-open Publication No. 58-140716 of unexamined Japanese Patent Application, which uses a first single crystal of BSO ($Bi_{12}SiO_{20}$) or BGO ($Bi_{12}GeO_{20}$) which has a property of causing an incident plane-polarized light beam to undergo dextrorotation of the polarization plane, and a second single crystal of BSO or BGO which has the same effective length as the first single crystal and which has a property of causing the light beam to undergo levorotation of the polarization plane. These first and second single crystals are bonded together in series in a direction of propagation of the light beam through the optical element, so that the properties of causing the dextrorotation and levorotation of the beam polarization plane may be offset or canceled by each other, so as to substantially eliminate an influence of the optical rotatory powers of the light beam while the beam is propagated through the single crystals.

Another type of optical component is disclosed in laid-open Publication No. 61-250572 of unexamined Japanese Patent Application. This optical component uses a first single crystal element having properties of causing the dextrorotation of the polarization plane of a beam and producing a magnetooptical effect or Faraday effect (polarization plane rotation of a beam when passing through the element in a magnetic field), and a second single crystal element having the properties of causing the levorotation of the beam polarization plane and producing the magnetooptical effect or the Faraday effect. These first and second single crystal elements are bonded together in series in the direction of propagation of the light beam. By adjusting the effective lengths of these single crystal elements, the temperature characteristic of the optical rotatory powers of the beam propagated through the elements may be canceled by the temperature characteristic of the magnetooptical effects of the elements, so as to minimize the temperature dependence of the optical component as a whole.

Usually, the intensity of the light beam which has been propagated through or emitted from such an optical component is used as a parameter or variable to be detected. Accordingly, it is desirable to minimize the amount of attenuation of the light while the light is propagated through the optical component (single crystal elements).

In the optical component as disclosed in the above-identified publications (Japanese laid-open publications Nos. 58-140716 and 61-250572), however, a bonding interface between the first and second single crystal elements having different optical properties acts as a reflecting surface since the two elements are disposed in series in the direction of propagation of the light beam, i.e., since the plane of bonding or adjoining interface of the two elements is perpendicular to the beam propagation direction. Consequently, the bonding interface necessarily increases the total number of the surfaces of the optical component (including the end faces of the single crystals) by which a certain portion of the light beam is reflected. Accordingly, the ratio of the portion of the light beam reflected by the optical component, to that of the beam transmitted through the component, is increased. Thus, the light beam is considerably attenuated while it is transmitted through the optical component. Where the optical component is used in an optical sensor whose output is determined by the intensity of the light beam emitted from the optical component, for example, in a magnetic-field sensor (as disclosed in the above-identified publications) for detecting the magnitude of a magnetic field to which the optical component is exposed, the sensing accuracy or sensitivity of the sensor inevitably tends to be lowered due to the attenuation of the light beam during propagation through the optical component. That is, the known optical component or sensor suffers from the relatively low sensitivity or sensing accuracy.

The optical component indicated above is incorporated in an optical unit of an optical device such as a magnetic-field sensor as disclosed in the publications identified above, which optical unit includes other optical components such as a polarizer and an analyzer. The single crystal elements of the optical component in question usually interposed between the polarizer and analyzer generally consist of single crystals each of which exhibits a magnetooptical or Faraday effect in the presence of a magnetic field, as well as exhibits the property of causing dextrorotation or levorotation of the plane of polarization of a light beam in the absence of a magnetic field.

In the optical magnetic-field sensor indicated above, the optical rotatory powers and the magnetooptical effects of the single crystal elements are influenced by or changed with a variation of the operating temperature of the sensor. To reduce the sensing error arising from this temperature variation, it is desirable that the temperature dependence of the rotations of the beam polarization plane be canceled by the temperature dependence of the magnetooptical effects, as proposed in the laid-open Publication No. 61-250572.

As pointed out above, however, the known optical magnetic-field sensor disclosed in the Publication No. 61-250572 suffers from the reflection of a relatively large portion of the incident light beam by the bonding interface of the first and second single crystal elements as well as by the end faces of the elements, because the bonding interface of the two elements having the different optical properties is normal to the direction of propagation of the light beam. Further, the arrangement of the optical sensor in question inherently has a certain slight residual difference in the angle of rotation due to the optical rotatory powers between the first and second single crystal elements. When the relevant optical component and the analyzer are disposed such that the plane of polarization of the light beam emitted from the optical component is rotated by 45° with respect to the plane of incidence of the analyzer about the optical axis of the sensor, the latter plane must be finely adjusted so as to compensate for the residual difference between the angles of rotation of the light polarization plane of the single crystal elements. This complicates the assembling procedure of the optical unit of the sensor.

SUMMARY OF THE INVENTION

The present invention was developed in view of the above-described situations in the prior art. It is accordingly a first object of the invention to provide an optical unit which has an optical component including at least one single crystal element having a property of causing dextrorotation of the polarization plane of a light beam propagated therethrough and at least one single crystal element having a property of causing levorotation of the beam polarization plane, and wherein the ratio of a portion of the light beam which is reflected by the single crystal elements is lowered to thereby substantially reduce the degree of attenuation of the light beam during propagation through the optical component.

A second object of the present invention is to provide an optical magnetic-field sensor comprising an optical component which includes at least one single crystal element having properties of causing dextrorotation of polarization plane of a light beam propagated therethrough and producing a magnetooptical effect, and at least one single crystal element having properties of causing levorotation of the beam polarization plane and producing the magnetooptical effect, and wherein the temperature dependences of the optical rotatory powers and the magnetooptical effects of the single crystal elements are minimized, and wherein the ratio of a portion of the light beam which is reflected by the single crystal elements is lowered to thereby substantially reduce the degree of attenuation of the light beam during propagation through the optical component. A further object of the invention is to provide such an optical magnetic-field sensor wherein the plane of polarization of the light beam emitted from the optical component and the plane of incidence of an analyzer of the sensor are rotated relative to each other by 45°, without a fine adjustment of the analyzer, and wherein the temperature dependence of the optical rotatory powers and the temperature dependence of the magnetooptical effects are canceled by each other, so as to improve the sensing accuracy of the sensor.

The above first object may be achieved according to one aspect of the present invention, which provides an optical unit through which a light beam is propagated in a predetermined direction, comprising an optical component which includes at least one first single crystal element each having a property of causing dextrorotation of a plane of polarization of the light beam propagated therethrough, and at least one second single crystal element each having a property of causing levorotation of the plane of polarization of the light beam. The first and second single crystal elements are superposed on each other in a direction perpendicular to the predetermined direction of propagation of the light beam through the optical unit.

The second and third objects of the invention may be achieved according to another aspect of the present invention, which provides an optical magnetic-field sensor for sensing a magnitude of a magnetic field, comprising a polarizer, an analyzer, and an optical component disposed between the polarizer and the analyzer in a direction of propagation of a light beam through the sensor. The optical component includes at least one first single crystal element each having properties of causing dextrorotation of a plane of polarization of the light beam propagated therethrough and producing a magnetooptical effect, and at least one second single crystal element each having properties of causing levorotation of the plane of polarization of the light beam and producing a magnetooptical effect. The first and second crystal elements are superposed on each other in a direction perpendicular to the direction of propagation of the light beam.

In the optical unit of the present invention, the first and second single crystal elements are preferably bonded together by direct solid-solid reaction of the elements, or by diffusion of a material of a thin bonding film interposed between the adjacent elements. In this case, the optical properties, mechanical strength and ease of handling of the single crystal elements may be considerably improved.

In the optical unit constructed according to the invention, the optical component having the plurality of single crystal elements having the different properties described above are superposed on each other in the direction perpendicular to the direction of propagation of the light beam through the optical element, so that the plane of each interface between the adjacent single crystal elements is parallel to the direction of propagation of the beam. Therefore, only the end faces of the single crystal elements reflect the light beam, namely, the number of the surfaces of the optical component which reflect the light beam is reduced as compared with that in the known optical component wherein the two or more single crystal elements are superposed on each other in the direction of propagation of the light beam, as disclosed in the publications indicated above. Consequently, the ratio of a portion of the light beam reflected by the optical component is reduced, and the degree of attenuation of the light beam during propagation through the optical component is accordingly reduced. However, the optical properties as provided by the known optical component may be maintained by suitably adjusting the effective lengths of the single crystal elements, and the ratio of the amount of the light incident upon the first single crystal element or elements to the amount of the light incident upon the second single crystal element or elements. Hence, where the present optical unit is utilized as a component of a magnetic-field sensor or other optical device, the sensing accuracy or sensitivity of the optical device may be significantly enhanced.

In the present optical unit, the light incident upon the single crystal element or elements having a property of causing dextrorotation of the light polarization plane is emitted from the element or elements, with the polarization plane rotated in the dextrorotatory direction with respect to that of the incident light. Conversely, the light incident upon the single crystal element or elements having a property of causing levorotation of the light polarization plane is emitted from the element or elements, with the polarization plane rotated in the levorotatory direction with respect to that of the incident light. The intensity of the light beam emitted from the optical component as a whole is detected as a sum of the intensity of the dextrorotatory light and the intensity of the levorotatory light.

Therefore, the total intensity of the light rays emitted from the optical component of the present optical unit as a whole is substantially the same as the optical output intensity of the known optical component consisting of the first and second single crystals of different optical polarization properties, provided that the amounts of the light rays incident upon the first and second single crystal elements of the present optical unit are equal to each other and the angles of dextrorotation and levorotation of the light polarization plane of the first and second elements are equal to each other, and provided that the first and second elements of the present optical unit have the same effective lengths and polarization angles as those of the known optical component. When the effective length of the first single crystal element or elements of the optical component of the present optical unit is made larger than that of the second element or elements (or when the amount of light incident upon the first element or elements is made larger than that incident upon the second element or elements), the overall intensity of the output rays from the optical component in question is substantially equal to the intensity of the output beam of the known optical component when the effective length of the first single crystal element or elements of the known optical component is made accordingly larger than that of the second element or elements. Similarly, when the effective length of the second single crystal element or elements of the optical component of the present optical unit is made larger than that of the first element or elements (or when the amount of light incident upon the second element or elements is made larger than that incident upon the first element or elements), the overall intensity of the output rays from the optical component in question is substantially equal to the intensity of the output beam of the known optical component when the effective length of the second single crystal element or elements of the known optical component is made accordingly larger than that of the first element or elements.

It will be understood from the above explanation that the optical component of the present optical unit maintains the optical properties as provided by the known optical component, by suitably adjusting the effective lengths of the single crystal elements, and the ratio of the amount of light incident upon the first crystal element or elements to the amount of light incident upon the second crystal element or elements. Yet, the optical component of the present optical unit assures a reduced degree of attenuation of the light during propagation therethrough, as compared with the attenuation of light in the known optical component. Therefore, the present optical unit, if utilized as a component of a magnetic-field sensor or other optical device, enables the optical device to provide improved sensing accuracy or sensitivity.

For example, the effective lengths of the first and second single crystal elements are adjusted such that the plane of polarization of the light beam is rotated by an angle which is a multiple of 90°, and the positions of the first and second single crystal elements in the direction in which they are superposed on each other are adjusted so as to adjust the proportions of the amounts of light incident upon the first and second single crystal elements, such that the temperature dependence of the optical rotatory power of the optical component is canceled by the temperature dependence of the magnetooptocal effects, while the planes of incidence of the polarizer and analyzer are held rotated 45° relative to each other. Namely, the instant optical unit does not require a fine adjustment of the incidence plane of the analyzer about the optical axis as required on a known magnetic-field sensor as disclosed in the laid-open Publication No. 61-250572 discussed above. The instant optical unit thus provides significant improvements in the sensing accuracy and ease of assembling of the sensor.

For increased stability of optical properties and mechanical strength and improved handling ease of the present optical unit, the first and second single crystal elements of the optical component are preferably bonded together into an integral body by means of direct solid-solid reaction bonding technique, or by means of indirect diffusion bonding using a bonding film of a suitable material such as a metal or ITO.

The first and second single crystal elements having the properties of causing dextrorotation and levorotation of polarization plane of light may consist, for example, of single crystals of $SiO_2$, $TeO_2$, $Pb_5Ge_3O_{11}$, BSO ($Bi_{12}SiO_{20}$), BGO ($Bi_{12}GeO_{20}$), or BTO ($Bi_{12}TiO_{20}$). Where the optical component is used for an optical magnetic-field sensor, the first and second single crystal elements generally consist of BSO, BGO, BTO or other single crystals which exhibit a magnetooptical effect (Faraday effect) as well as the properties which cause the polarization plane of a light beam to be rotated in the absence of a magnetic field.

The optical component of the present optical unit may consist of one first single crystal element for dextrorotation of the polarization plane of light, and one second single crystal element for levorotation of the polarization plane of light. However, the optical component may consist of a plurality of first single crystal elements and a plurality of second single crystal elements, which are arranged alternately or regularly in a predetermined order, or irregularly in a random order. Further, the optical component may consist of one first single crystal element, and a plurality of second single crystal elements, or alternately consist of a plurality of first single crystal elements, and one second single crystal element. That is, the principle of the present invention requires at least one first single crystal element and at least one second single crystal element which are superposed on each other in the direction perpendicular to the direction in which the light beam is propagated through the optical unit.

While the first and second single crystal elements are preferably physically bonded together by direct solid-solid reaction or by indirect diffusion using a thin bonding film, for improved stability of optical properties, mechanical strength and handling ease of the optical component, it is possible that the single crystal elements are mechanically held together by a suitable jig or fixture, or tentatively fixed together by means of hydrochloric acid, nitric acid, water or other medium.

In the case where the single crystal elements are bonded together by direct solid-solid reaction, the bonding surfaces of the elements are first polished, and the elements are butted together at the polished surfaces. The elements are then subjected to a heat treatment at a suitable elevated temperature. The temperature and time for the heat treatment are determined depending upon the material of the single crystal elements. For instance, if the elements are single crystals of BSO or BGO, the crystals are maintained for about five hours at a temperature of about 800° C. If TeO₂ crystals are used, they are held for about four hours at a temperature of about 600° C. In the case of SiO₂ crystals, the heat treatment is effected for about five hours at a temperature of about 450° C.

Where the single crystal elements are diffusion-bonded together by means of a suitable thin bonding film, each polished bonding surface of the elements is provided with such a thin bonding film by sputtering, vapor deposition or other suitable method. The elements are butted together at the coated surfaces, and are subjected to a heat treatment for diffusion bonding. The heat treatment temperature and time for the diffusion bonding are determined suitably depending upon the material of the single crystal elements, as in the solid-solid bonding process, and also depending upon the material of the bonding film interposed between the adjacent elements. In the case where the single crystal elements are single crystals of SiO₂ and the bonding film is made of Ti, the heat treatment for diffusion-bonding the crystals into an integral body is effected for about five hours at a temperature of about 450° C. In the case of the single crystals of TeO₂ and the bonding film of Cr, the heat treatment is effected for about four hours at a temperature of about 600° C. In the case of the single crystals of BSO or BGO and the bonding film of Ti or Cr, the assembly of the crystals and bonding film or films is held at a temperature of about 800° C. for about five hours. The bonding film may be formed of metallic materials other than Ti, Cr, such as Au, or a non-metallic material such as ITO, SiO₂, TiO₂, MgF₂.

BRIEF DESCRIPTION OF THE DRAWINGS

The above and optional objects, features and advantages of the present invention will become more apparent by reading the following description of presently preferred embodiments of the invention, when considered in connection with the accompanying drawings, in which.

DETAILED DESCRIPTION OF THE INVENTION

Figure 1A:
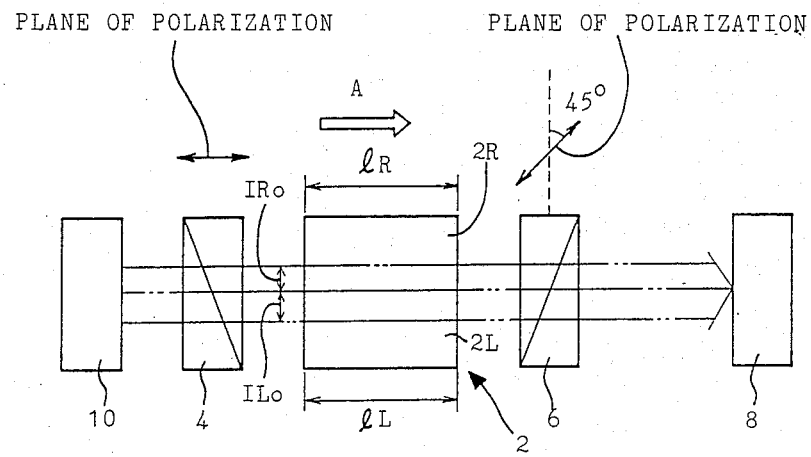
FIGS. 1(a) and 2(a) are schematic views illustrating presently preferred forms of an optical magnetic-field sensor of the present invention.
Figure 2A:
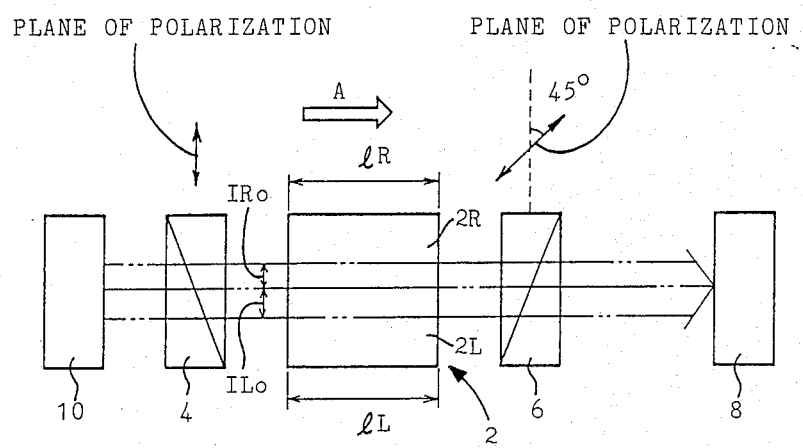

Referring to FIGS. 1(a) and 2(a) showing optical magnetic-field sensors, reference characters 2R and 2L, respectively, designate a first and a second single crystal element in the form of single crystals of BSO, BGO or BTO. The single crystal 2R has properties of causing dextrorotation of the polarization plane of a linearly- or plane-polarized light beam propagated therethrough in the absence of a magnetic field, and producing a magnetooptical or Faraday effect (i.e., causing rotation of the polarization plane of a light beam propagated through the crystal placed in a magnetic field). On the other hand, the single crystal 2L has properties of causing levorotation of the polarization plane of a light beam propagated therethrough, and producing the magnetooptical or Faraday effect. The single crystals 2R and 2L are superposed on each other in the direction perpendicular to the direction in which a light beam is propagated through the magnetic-field sensor. Each of the sensors of FIGS. 1(a) and 2(a) which uses a thus constructed optical component 2 includes a polarizer 4 and an analyzer 6, which are disposed such that the optical component 2 is disposed between the polarizer 4 and the analyzer 6 in the direction of propagation of the light beam. In FIGS. 1(a) and 2(a), the light beam is indicated by two-dot chain lines.

Figure 1B:
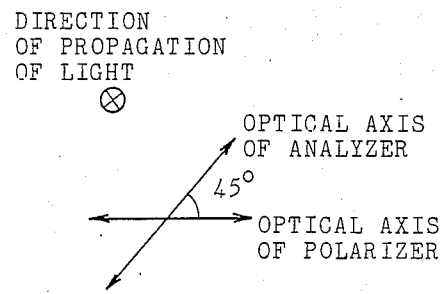
FIGS. 1(b) and 2(b) are views indicating a positional relationship between a polarizer and an analyzer of the sensors of FIGS. 1(a) and 2(a).
Figure 2B:
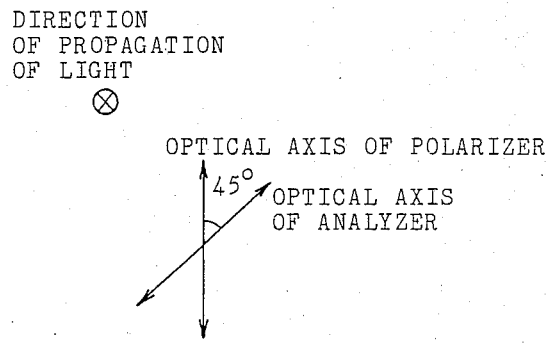

For easier assembling of the magnetic-field sensors, the polarizer 4 and the analyzer 6 are positioned such that their planes of incidence are rotated by 45° relative to each other about the optical axis, of the sensors, as also indicated in FIGS. 1(b) and 2(b). Further, a length $l_R$ of the single crystal 2R and a length $l_L$ of the single crystal 2L are determined so that an angle $\Psi$ of rotation of the polarization plane of the light beam as a result of propagation of the beam through the crystals 2R, 2L in the absence of a magnetic field is equal to a multiple of 90°, for enabling the sensor to provide a maximum sensitivity to detect the strength of a magnetic field. The light beam propagated through the analyzer 6 is received by a light-sensitive detector 8, whose output signal represents an intensity I of the light beam as received by the detector 8. The intensity I is approximately expressed by the following equations (1) and (1'):

$$I = \frac{I_{RO}}{2} \{1 - 2Ve(1 + \alpha\Delta T)l_R H + 2\theta\beta\Delta Tl_R\} + \quad (1)$$

$$\frac{I_{LO}}{2} \{1 - 2Ve(1 + \alpha\Delta T)l_L H - 2\theta\beta\Delta Tl_L\}$$

$$I = \frac{I_{RO}}{2} \{1 + 2Ve(1 + \alpha\Delta T)l_R H - 2\theta\beta\Delta Tl_R\} + \quad (1')$$

$$\frac{I_{LO}}{2} \{1 + 2Ve(1 + \alpha\Delta T)l_L H + 2\theta\beta\Delta Tl_L\}$$

where, $I_{RO}$: Amount of the light propagated through the single crystal 2R $I_{LO}$: Amount of the light propagated through the single crystal 2L Ve: Verdet's constant H: AC magnetic field (indicated at A) applied to the optical component 2, which is equal to $H_o\sin\Omega t$, where $H_o$: amplitude of the magnetic field, $\Omega$: angular velocity $\alpha$: Temperature coefficient of Verdet's constant $\beta$: Temperature coefficient of optical rotatory power $\theta$: Rotation angle of polarization plane (=optical rotatory power) at nominal operating temperature $\Delta T$: Difference between actual and nominal operating temperatures In the magnetic-field sensor shown in FIG. 1(a), the intensity I of the light beam propagated through the optical component 2 is represented by the equation (1) where the rotation angle $\Psi$ of the polarization plane of the beam is an odd-number multiple of 90°, while the intensity I is represented by the equation (1') where the rotation angle $\Psi$ is an even-number multiple of 90°. In the magnetic-field sensor shown in FIG. 2(a), therefore, the intensity I is represented by the equation (1) where the rotation angle $\Psi$ is an even-number multiple of 90°, and by the equation (1') where the rotation angle $\Psi$ is an odd-number multiple of 90°.

As indicated above, the relationship between the equations (1) and (1') representing the intensity I of the light beam propagated through the optical component 2, and the odd-number and even-number multiples of 90° of the rotation angle $\Psi$ are reversed between the two different forms of the magnetic-field sensors of FIGS. 1(a) and 2(a). Since the two forms of the sensors are identical with each other except for the above relationship, the following description refers to the sensor of FIGS. 1(a) and 1(b) only, in the interest of brevity and simplification. It is also noted that while the optical component used in the sensors shown in the drawings consists of the two single crystals 2R and 2L, it is to be understood that the optical component is not limited to this arrangement, but may include two or more single crystals 2R and/or two or more single crystals 2L. That is, the principle of the invention requires the optical component to consist of at least one first single crystal element 2R and at least one second single crystal element 2L. In FIGS. 1(a) and 2(a), reference numeral 10 designates a light source which produces a light beam which is incident upon the polarizer 4, so that the linearly- or plane-polarized light beam is incident upon the optical component 2R, 2L. Further, reference character A indicates the direction of the magnetic field, whose strength is sensed by the sensors.

In the magnetic-field sensor, the light-sensitive detector 8 receives the light beam propagated through the analyzer 6, whose intensity I consists of an AC component and a DC component, and the output of the detector 8 represents a ratio of the AC component to the DC component (AC component/DC component). A sensitivity R of the detector 8 to detect the intensity I is expressed by the following equation (2) where the rotation angle $\Psi$ of the light polarization plane is an odd-number multiple of 90° (in the sensor of FIG. 1(a)), and by the following equation (2') where the rotation angle $\Psi$ is an even-number multiple of 90°:

$$R = \frac{-I_{RO}V_e(1 + \alpha\Delta T)l_R H - I_{LO}V_e(1 + \alpha\Delta T)l_L H}{I_{RO}/2 + I_{RO}\theta\beta\Delta Tl_R + I_{LO}/2 - I_{LO}\theta\beta\Delta Tl_L} \quad (2)$$

$$R = \frac{I_{RO}V_e(1 + \alpha\Delta T)l_R H + I_{LO}V_e(1 + \alpha\Delta T)l_L H}{I_{RO}/2 - I_{RO}\theta\beta\Delta Tl_R + I_{LO}/2 + I_{LO}\theta\beta\Delta Tl_L} \quad (2')$$

It will be obviously understood that the temperature dependence of the spontaneous rotation of the light polarization plane of the single crystals 2R, 2L may be offset or canceled by the temperature dependence of the magnetooptical effect of the crystals 2R, 2L, by adjusting the ratio ($I_{LO}/I_{RO}$) of the quantities $I_{RO}$ and $I_{LO}$ of light propagated or transmitted through the crystals 2R, 2L, and the lengths $l_R$, $l_L$ of the crystals 2R, 2L, so as to satisfy the following equations (3) and (3') where the rotation angle $\Psi$ is an odd-number multiple of 90°, or the following equations (4) and (4') derived from the equations (3) and (3') where the rotation angle $\Psi$ is an even-number multiple of 90°. Thus, the magnetic-field sensor may be protected from a variation in the output due to a change in the operating temperature, and consequently provide improved sensing accuracy or sensitivity. The equations (3) and (3') may be derived by setting $\Delta T$ in the equations (2) and (2') to zero, i.e., $R(\Delta T) = R(\Delta T = 0)$.

$$\frac{-I_{RO}V_e(1 + \alpha\Delta T)l_R H - I_{LO}V_e(1 + \alpha\Delta T)l_L H}{I_{RO}/2 + I_{RO}\theta\beta\Delta Tl_R + I_{LO}/2 - I_{LO}\theta\beta\Delta Tl_L} = \quad (3)$$

-continued $$\frac{-I_{RO}V_e l_R H - I_{LO}V_e l_L H}{I_{RO}/2 + I_{LO}/2}$$

$$\frac{I_{RO}V_e(1 + \alpha\Delta T)l_R H + I_{LO}V_e(1 + \alpha\Delta T)l_L H}{I_{RO}/2 - I_{RO}\theta\beta\Delta Tl_R + I_{LO}/2 + I_{LO}\theta\beta\Delta Tl_L} = \quad (3')$$

$$\frac{I_{RO}V_e l_R H + I_{LO}V_e l_L H}{I_{RO}/2 + I_{LO}/2}$$

$$\frac{\alpha}{2}(I_{RO} + I_{LO}) - \beta\theta(I_{RO}l_R - I_{LO}l_L) = 0 \quad (4)$$

$$\frac{\alpha}{2}(I_{RO} + I_{LO}) + \beta\theta(I_{RO}l_R - I_{LO}l_L) = 0 \quad (4')$$

Described more specifically, the present optical magnetic-field sensor wherein the incidence planes of the polarizer 4 and analyzer 6 are rotated to 45° relative to each other is capable of detecting the strength of a magnetic field and the amount of an electric current producing the magnetic field, with maximum sensing accuracy and minimum detecting error due to the temperature variation, by determining the lengths $l_R$ and $l_L$ of the single crystals 2R and 2L so that the rotation angle $\Psi$ of the light polarization plane is a multiple of 90°, and by adjusting the proportions of the quantities of light which are incident upon the single crystals 2R, 2L, namely, by simply adjusting the position of the optical component 2 in the direction in which the single crystals 2R, 2L are superposed on each other, i.e., in the direction perpendicular to the direction of propagation of the light beam through the optical unit 2, 4, 6. Accordingly, the present sensor eliminates a fine adjustment of the incidence plane of the analyzer 6 to compensate for the inevitable difference in the angle of rotation due to optical rotatory powers between the single crystals 2R and 2L, which is experienced in a known magnetic-field sensor as disclosed in the above-identified laid-open Publication No. 61-250572.

In the magnetic-field sensor, where the single crystals 2R and 2L have the same length ($l = l_R = l_L$), the ratio k ($I_{LO}/I_{RO}$) of the quantity $I_{LO}$ of light incident upon the single crystal 2L to the quantity $I_{RO}$ of light incident upon the single crystal 2R, and the proportions of the quantities $I_{RO}$ and $I_{LO}$ may be calculated in the following manner:

In the case where the rotation angle $\Psi$ of light polarization plane of the single crystals 2R, 2L is an odd-number multiple of 90° in the sensor of FIGS. 1(a), the following equations (5) and (6) are obtained from the above equation (4):

$$\frac{\alpha}{2} \times I_{RO} \times (1 + k) - \beta \times \theta \times I_{RO} \times l \times (1 - k) = 0 \quad (5)$$

$$\frac{\alpha}{2} \times (1 + k) - \beta \times \theta \times l \times (1 - k) = 0 \quad (6)$$

Since $l = \Psi/\theta$, the above equation (6) may be converted into the following equation (7):

$$\frac{\alpha}{2} \times (1 + k) - \beta \times \Phi \times (1 - k) = 0 \quad (7)$$

Thus, the ratio k ($= I_{LO}/I_{RO}$) can be obtained from the following equation (8), and the proportions of the quantities $I_{RO}$ and $I_{LO}$ can be calculated based on the obtained ratio k:

$$k=(\beta\times\Psi-\alpha/2)/(\beta\times\Psi+\alpha/2) \qquad (8)$$

Where the rotation angle $\Psi$ is an even-number multiple of 90°, the ratio k can be obtained from the following equation (8'), which can be obtained from the above equation (4') in the same manner as the equation (8) is obtained:

$$k=(\beta\times\Psi+\alpha/2)/(\beta\times\Psi-\alpha/2) \qquad (8')$$

For example, where a light beam having a wavelength of 870 nm is propagated through the single crystals 2R, 2L of BSO having lengths l indicated in Table 1 below, the ratio k ($I_{LO}/I_{RO}$) and the proportion $I_{RO}$ are calculated from the above equations (8) and (8'), as indicated in Table 1 in relation to the rotation angle $\Psi$.

TABLE 1

| ($\psi$) | k | $I_{RO}$ (%) | Length (mm) |
|---|---|---|---|
| 90 | 1.406 | 41.56 | 8.57 |
| 180 | 0.844 | 54.22 | 17.14 |
| 270 | 1.119 | 47.19 | 25.71 |
| 360 | 0.919 | 52.11 | 34.29 |
| 450 | 1.070 | 48.31 | 42.86 |

EXAMPLES

To further clarify the concept of the present invention, some examples of the invention will be described. However, it is to be understood that the invention is not limited to the details of these illustrated examples, but may be embodied with various changes, modifications and improvements, which may occur to those skilled in the art, without departing from the spirit and scope of the invention defined in the appended claims.

EXAMPLE 1

The single crystals 2R and 2L having the same length ($l_{RO}$, $l_{LO}$) of 8.57 mm and the same thickness were prepared respectively from a single crystal of BSO ($Bi_{12}SiO_{20}$) having properties of the causing dextrorotation of polarization plane of a light beam propagated therethrough and producing a magnetooptical effect, and another single crystal of BSO having properties of causing levorotation of the light polarization plane and producing the magnetooptical effect. The bonding surfaces of the crystals 2R, 2L were polished, and the crystals were butted together at the polished surfaces. The assembly was then held at 800° C. for five hours, whereby the two single crystals 2R, 2L were bonded together by direct solid-solid reaction, into an integral body of the optical component 2. The thus prepared optical element 2 was positioned between the polarizer 4 and the analyzer 6. The position of the element 2 in the direction in which the two crystals 2R, 2L are superposed on each other is adjusted such that the proportions of the light $I_{RO}$ and the light $I_{LO}$ which are propagated through the two crystals 2R and 2L are 41.6% and 58.4%. respectively. Thus, an optical magnetic-field sensor as shown in FIG. 1(a) was prepared. The light source 10 was adapted to produce a light beam having a wavelength of 870 nm.

The sensor was exposed to a magnetic field H of 100 Oe in the direction A as indicated in FIG. 1(a), and the output of the detector 8 was measured while the environmental temperature was changed from −20° C. to 80° C. The measurement revealed a detecting error or output variation as small as 0.3% or less due to the temperature change.

EXAMPLE 2

The single crystals 2R and 2L having the same length ($l_{RO}$, $l_{LO}$) of 8.57 mm and the same thickness were prepared respectively from a single crystal of BSO having properties of the causing dextrorotation of polarization plane of a light beam propagated therethrough and producing a magnetooptical effect, and another single crystal of BSO having properties of causing levorotation of the light polarization plane and producing the magnetooptical effect. The bonding surfaces of the crystals 2R, 2L were polished, and a bonding film of Ti having a thickness of several hundreds of angstroms was formed by sputtering on the polished surface of each crystal 2R, 2L. The two crystals 2R, 2L were butted together at the bonding films, and then the assembly was held at 800° C. for five hours, whereby the two single crystals 2R, 2L were diffusion-bonded together by means of the Ti bonding films, into an integral body of the optical component 2. An optical magnetic-field sensor was prepared in the same manner as in Example 1, by using the thus prepared optical component 2.

The sensor was exposed to a magnetic field H of 100 Oe in the direction A as indicated in FIG. 1(a), and the output of the detector 8 was measured while the environmental temperature was changed from −20° C. to 80° C. The measurement revealed a detecting error or output variation as small as 0.3% or less due to the temperature change.

EXAMPLE 3

The single crystals 2R and 2L having the same length ($l_{RO}$, $l_{LO}$) of 17.14 mm and the same thickness were prepared respectively from a single crystal of BSO having properties of the causing dextrorotation of polarization plane of a light beam propagated therethrough and producing a magnetooptical effect, and another single crystal of BSO having properties of causing levorotation of the light polarization plane and producing the magnetooptical effect. The bonding surfaces of the crystals 2R, 2L were polished, and the crystals were butted together at the polished surfaces. The assembly was then held at 800° C. for five hours, whereby the two single crystals 2R, 2L were bonded together by direct solid-solid reaction, into an integral body of the optical component 2. The thus prepared optical element 2 was positioned between the polarizer 4 and the analyzer 6. The position of the element 2 in the direction in which the two crystals 2R, 2L are superposed on each other is adjusted such that the proportions of the light $I_{RO}$ and the light $I_{LO}$ which are propagated through the two crystals 2R and 2L are 54.2% and 45.8%, respectively. Thus, an optical magnetic-field sensor as shown in FIG. 1(a) was prepared. The light source 10 was adapted to produce a light beam having a wavelength of 870 nm.

The sensor was exposed to a magnetic field H of 100 Oe in the direction A as indicated in FIG. 1(a), and the output of the detector 8 was measured while the environmental temperature was changed from −20° C. to 80° C. The measurement revealed a detecting error or output variation as small as 0.3% or less due to the temperature change.

EXAMPLE 4

The single crystals 2R and 2L having the same length ($l_{RO}$, $l_{LO}$) of 17.14 mm and the same thickness were prepared respectively from a single crystal of BSO having properties of the causing dextrorotation of polarization plane of a light beam propagated therethrough and producing a magnetooptical effect, and another single crystal of BSO having properties of causing levorotation of the light polarization plane and producing the magnetooptical effect. The bonding surfaces of the crystals 2R, 2L were optically polished, and a bonding film of Cr having a thickness of several hundreds of angstroms was formed by sputtering on the polished surface of each crystal 2R, 2L. The two crystals 2R, 2L were butted together at the bonding films, and then the assembly was held at 800° C. for five hours, whereby the two single crystals 2R, 2L were diffusion-bonded together by means of the Cr bonding films, into an integral body of the optical component 2. An optical magnetic-field sensor was prepared in the same manner as in Example 3, by using the thus prepared optical component 2.

The sensor was exposed to a magnetic field H of 100 Oe in the direction A as indicated in FIG. 1(a), and the output of the detector 8 was measured while the environmental temperature was changed from −20° C. to 80° C. The measurement revealed a detecting error or output variation as small as 0.3% or less due to the temperature change.

EXAMPLE 5

The single crystals 2R and 2L having the same length ($l_{RO}$, $l_{LO}$) of 9.38 mm and the same thickness were prepared respectively from a single crystal of BGO ($Bi_{12}GeO_{20}$) having properties of the causing dextrorotation of polarization plane of a light beam propagated therethrough and producing a magnetooptical effect, and another single crystal of BGO having properties of causing levorotation of the light polarization plane and producing the magnetooptical effect. The bonding surfaces of the crystals 2R, 2L were polished, and the crystals were butted together at the polished surfaces. The assembly was then held at 850° C. for five hours, whereby the two single crystals 2R, 2L were bonded together by direct solid-solid reaction, into an integral body of the optical component 2. The thus prepared optical element 2 was positioned between the polarizer 4 and the analyzer 6. The position of the element 2 in the direction in which the two crystals 2R, 2L are superposed on each other is adjusted such that the proportions of the light $I_{RO}$ and the light $I_{LO}$ which are propagated through the two crystals 2R and 2L are 41.6% and 58.4%, respectively. Thus, an optical magnetic-field sensor as shown in FIG. 1(a) was prepared. The light source 10 was adapted to produce a light beam having a wavelength of 870 nm.

The sensor was exposed to a magnetic field H of 100 Oe in the direction A as indicated in FIG. 1(a), and the output of the detector 8 was measured while the environmental temperature was changed from −20° C. to 80° C. The measurement revealed a detecting error or output variation as small as 0.3% or less due to the temperature change.

EXAMPLE 6

The single crystals 2R and 2L having the same length ($l_{RO}$, $l_{LO}$) of 9.38 mm and the same thickness were prepared respectively from a single crystal of BGO having properties of the causing dextrorotation of polarization plane of a light beam propagated therethrough and producing a magnetooptical effect, and another single crystal of BGO having properties of causing levorotation of the light polarization plane and producing the magnetooptical effect. The bonding surfaces of the crystals 2R, 2L were polished, and a bonding film of Ti having a thickness of several hundreds of angstroms was formed by sputtering on the polished surface of each crystal 2R, 2L. The two crystals 2R, 2L were butted together at the bonding films, and then the assembly was held at 800° C. for five hours, whereby the two single crystals 2R, 2L were diffusion-bonded together by means of the Ti bonding films, into an integral body of the optical component 2. An optical magnetic-field sensor was prepared in the same manner as in Example 5, by using the thus prepared optical component 2.

The sensor was exposed to a magnetic field H of 100 Oe in the direction A as indicated in FIG. 1(a), and the output of the detector 8 was measured while the environmental temperature was changed from −20° C. to 80° C. The measurement revealed a detecting error or output variation as small as 0.3% or less due to the temperature change.

What is claimed is:

1. An optical unit through which a light beam is propagated in a predetermined direction, comprising an optical component which includes at least one first single crystal element having a property of causing dextrorotation of a plane of polarization of said light beam propagated therethrough, and at least one second single crystal element having a property of causing levorotation of the plane of polarization of said light beam propagated therethrough, said first crystal element and said second crystal element being in an adjacent, side-by-side relationship such that a contacting interface plane between said first crystal element and said second crystal element is parallel to said predetermined direction of propagation of said light beam.

2. The optical unit of claim 1, wherein said first crystal element and said second crystal element are bonded together by direct solid-solid reaction.

3. The optical unit of claim 1, further comprising at least one bonding film interposed between adjacent ones of said first crystal element and said second crystal element, and wherein said first crystal element and said second crystal element are bonded together by diffusion of a material of said bonding film into said first crystal element and said second crystal element.

4. The optical unit of claim 1, wherein each of said first crystal element and said second crystal element consists of a single crystal selected from the group consisting of $SiO_2$, $TeO_2$, $Pb_5Ge_3O_{11}$, $Bi_{12}SiO_{20}$, $Bi_{12}GeO_{20}$, and $Bi_{12}TiO_{20}$.

5. An optical magnetic-field sensor for sensing a magnitude of a magnetic field, comprising a polarizer, an analyzer, and an optical component disposed between said polarizer and said analyzer in a direction of propagation of a light beam through the sensor, said optical component including at least one first single crystal element having properties of causing dextrorotation of a plane of polarization of said light beam propagated therethrough and producing a magnetooptical effect, and at least one second single crystal element having properties of causing levorotation of the plane of polarization of said light beam and producing a magnetooptical effect, said first crystal element and said second crystal element being in an adjacent, side-by-side relationship such that a contacting interface plane between said first crystal element and said second crystal element is parallel to said predetermined direction of propagation of said light beam.

* * * * *